(12) United States Patent
Horng et al.

(10) Patent No.: US 8,498,601 B2
(45) Date of Patent: Jul. 30, 2013

(54) POLAR RECEIVER USING INJECTION-LOCKING TECHNIQUE

(75) Inventors: Tzyy-Sheng Horng, Kaohsiung (TW);
Chi-Tsan Chen, Kaohsiung (TW);
Chieh-Hsun Hsiao, Kaohsiung (TW);
Kang-Chun Peng, Kaohsiung (TW)

(73) Assignee: National Sun Yat-Sen University, Kaohsiung City (TW)

( * ) Notice: Subject to any disclaimer, the term of this patent is extended or adjusted under 35 U.S.C. 154(b) by 0 days.

(21) Appl. No.: 13/486,157

(22) Filed: Jun. 1, 2012

(65) Prior Publication Data
US 2013/0143509 A1 Jun. 6, 2013

(30) Foreign Application Priority Data

Dec. 2, 2011 (TW) .............................. 100144416 A

(51) Int. Cl.
*H04B 1/06* (2006.01)
*H04B 7/00* (2006.01)

(52) U.S. Cl.
USPC ........... 455/265; 455/208; 455/214; 455/255; 455/258; 455/263

(58) Field of Classification Search
USPC ................. 455/130, 131, 208, 205, 209, 214, 455/226.1, 230, 232.1, 236.1, 255–260, 263, 455/265, 269, 293
See application file for complete search history.

(56) References Cited

U.S. PATENT DOCUMENTS

| | | | |
|---|---|---|---|
| 6,252,469 B1 * | 6/2001 | Suematsu | 331/117 D |
| 6,608,875 B1 * | 8/2003 | Wolaver | 375/375 |
| 6,961,547 B2 * | 11/2005 | Rozenblit et al. | 455/118 |
| 7,557,664 B1 * | 7/2009 | Wu | 331/51 |
| 7,899,422 B1 * | 3/2011 | Teo et al. | 455/258 |
| 7,940,830 B2 * | 5/2011 | Marsili et al. | 375/134 |
| 8,174,325 B1 * | 5/2012 | Leung et al. | 331/2 |
| 8,384,485 B2 * | 2/2013 | Fortier et al. | 327/156 |
| 2011/0003571 A1 * | 1/2011 | Park et al. | 455/258 |
| 2011/0050296 A1 * | 3/2011 | Fagg | 327/118 |
| 2012/0306547 A1 * | 12/2012 | Arora et al. | 327/119 |

OTHER PUBLICATIONS

Chen, Chi-Tsan et al., Wireless Polar Receiver Using Two Injection-Locked Oscillator Stages for Green Radios, 2011 IEEE-MTT-S International Microwave Symposium, Baltimore, MD, Jun. 5, 2011.

* cited by examiner

*Primary Examiner* — Pablo Tran
(74) *Attorney, Agent, or Firm* — Jackson IPG PLLC

(57) ABSTRACT

A polar receiver using injection-locking technique includes an antenna, a first filter, a first voltage-controlled oscillator, a first mixer, a frequency discriminator, a second filter, a third filter, a first analog-digital converter, a second analog-digital converter and a digital signal processing unit. Mentioned polar receiver enables to separate an envelope signal and a frequency-modulated signal from a radio frequency signal received from the antenna via the injection locking technique of the first voltage-controlled oscillator and the frequency discriminator. The envelope component and the frequency-modulated component can be digitally processed by the digital signal processing unit to accomplish polar demodulation.

7 Claims, 4 Drawing Sheets

POLAR RECEIVER USING INJECTION-LOCKING TECHNIQUE

FIELD OF THE INVENTION

The present invention is generally related to a polar receiver, which particularly relates to the polar receiver using injection-locking technique.

BACKGROUND OF THE INVENTION

Conventional direct-conversion receiver is the most commonly used receiver architecture today for wireless communication. However, the direct-conversion receiver utilizes carrier recovery techniques based on phase-locked loop for achieving coherent demodulation function, which increases circuit complexity and power consumption of the receiver. Therefore, the application of the direct-conversion receiver is substantially limited.

SUMMARY

The primary object of the present invention is to provide a polar receiver using injection-locking technique including an antenna, a first filter electrically connected with the antenna, a first voltage-controlled oscillator electrically connected with the first filter, a first mixer electrically connected with the first filter and the first voltage-controlled oscillator, a frequency discriminator electrically connected with the first voltage-controlled oscillator, a second filter electrically connected with the first mixer, a third filter electrically connected with the frequency discriminator, a first analog-digital converter electrically connected with the second filter, a second analog-digital converter electrically connected with the third filter, and a digital signal processing unit electrically connected with the first analog-digital converter and the second analog-digital converter.

In this invention, the polar receiver using injection-locking technique combines the injection-locking function of the first voltage-controlled oscillator with the first mixer and the second filter to separate an envelope component from a radio frequency signal received from the antenna. The polar receiver further combines the injection-locking function of the first voltage-controlled oscillator with the frequency discriminator and the third filter to separate a frequency-modulated component from a radio frequency signal received from the antenna. The envelope component and the frequency-modulated component can be digitally processed by the digital signal processing unit so as to accomplish radio frequency signal demodulation. Owing to simplicity, low cost and high energy efficiency of the present invention, the proposed polar receiver has great potential in applications for green radio.

DETAILED DESCRIPTION OF THE INVENTION

Figure 1:
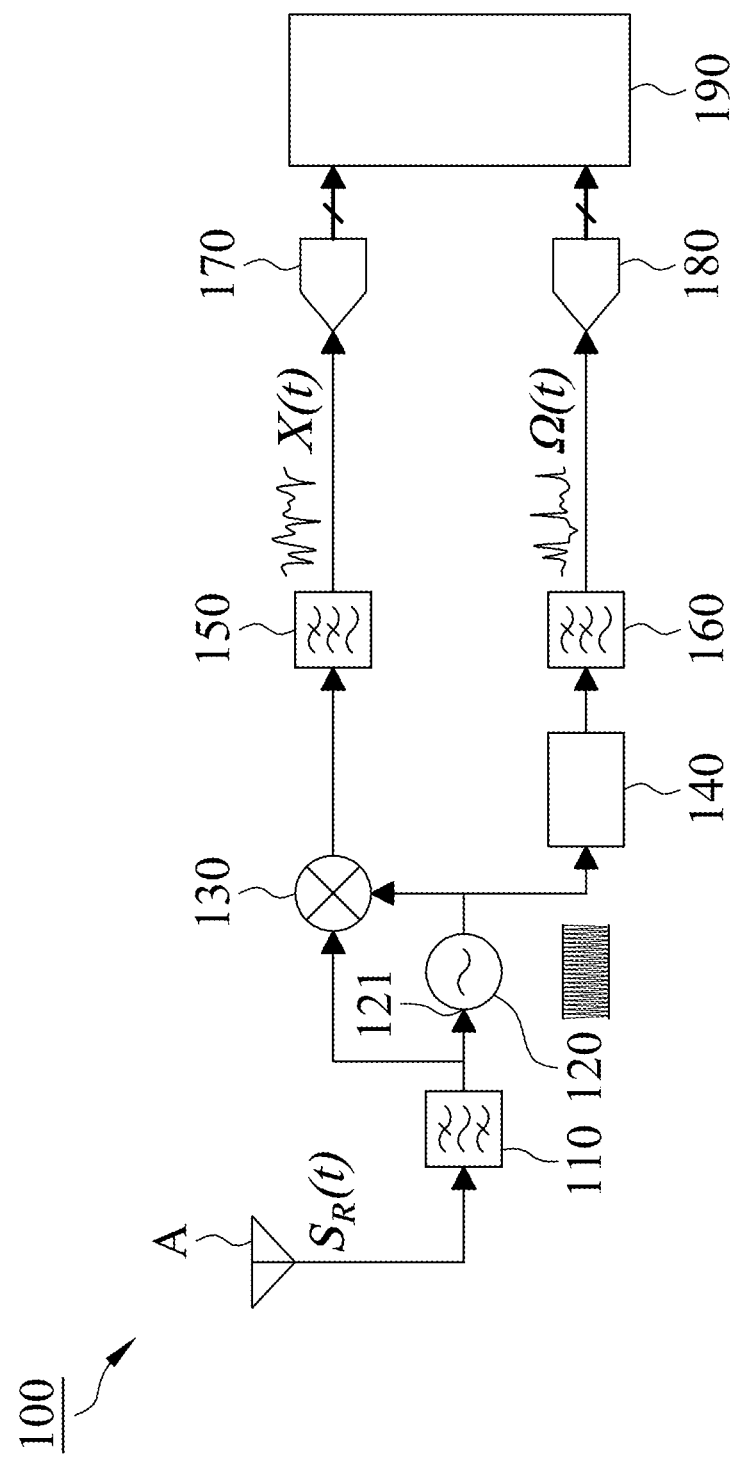
FIG. 1 is a circuit diagram of a polar receiver using injection-locking technique with a preferred embodiment of the present invention.

With reference to FIG. 1, a polar receiver using injection-locking technique 100 in accordance with a preferred embodiment of the present invention includes an antenna A, a first filter 110 electrically connected with the antenna A, a first voltage-controlled oscillator 120 electrically connected with the first filter 110, a first mixer 130 electrically connected with the first filter 110 and the first voltage-controlled oscillator 120, a frequency discriminator 140 electrically connected with the first voltage-controlled oscillator 120, a second filter 150 electrically connected with the first mixer 130, a third filter 160 electrically connected with the frequency discriminator 140, a first analog-digital converter 170 electrically connected with the second filter 150, a second analog-digital converter 180 electrically connected with the third filter 160, and a digital signal processing unit 190 electrically connected with the first analog-digital converter 170 and the second analog-digital converter 180. Referring to FIG. 1 again, the antenna A is configured to receive a radio frequency signal $S_R(t)$, wherein the radio frequency signal $S_R(t)$ includes an envelope component and a frequency modulated component (or phase modulated component). The first filter 110 receives the radio frequency signal $S_R(t)$ from the antenna A. For the reason that the first filter 110 is a band pass filter, the first filter 110 filters unnecessary low frequency and high frequency noises of the radio frequency signal $S_R(t)$ and outputs an initial signal. The first voltage-controlled oscillator 120 receives the initial signal from the first filter 110 and outputs an output signal, and the output signal has an oscillation frequency $\omega_{out}$. The first voltage-controlled oscillator 120 has a signal-injection port 121, and the initial signal is injected into the signal-injection port 121. When the first voltage-controlled oscillator 120 is in injection-locked state, the oscillation frequency $\omega_{out}$ of the output signal is equal to an injected frequency $\omega_{inj}$. The first mixer 130 combines the initial signal and the output signal of the injection-locked first voltage-controlled oscillator 120 to form a mixed signal. The second filter 150 receives the mixed signal from the first mixer 130 and outputs an envelope signal X(t).

Figure 4A:
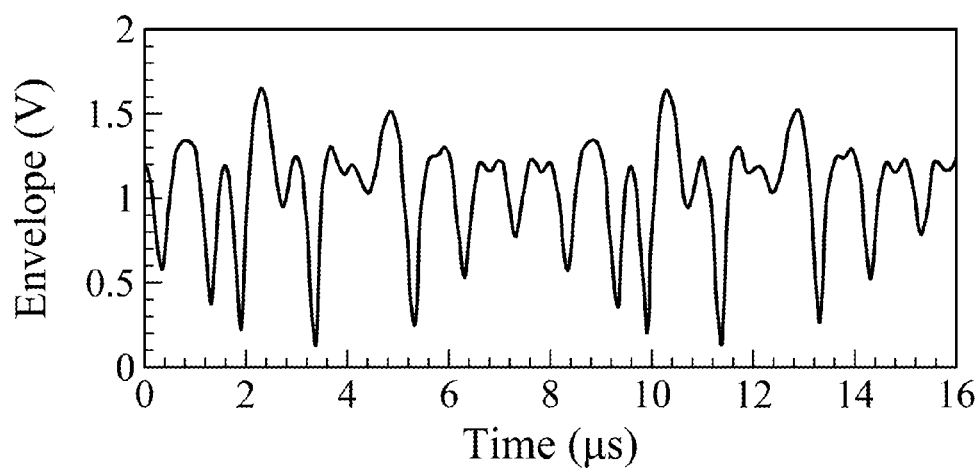
FIG. 4A is an oscillogram of an envelope signal of the polar receiver using injection-locking technique with a preferred embodiment of the present invention.

In this embodiment, the second filter 150 is a low-pass filter. A harmonic distortion phenomenon may be occurred via the high frequency harmonics that is contained in the mixed signal. With the low pass filter, the high frequency harmonics can be effectively filtered therefore outputting the envelope signal X(t). The polar receiver using injection-locking technique 100 combines injection-locking function of the first voltage-controlled oscillator 120 with signal mixing of the first mixer 130 and harmonics filtration of the second filter 150 so as to effectively separate the envelope component from the radio frequency signal $S_R(t)$, as indicated in FIG. 4A.

Figure 2:
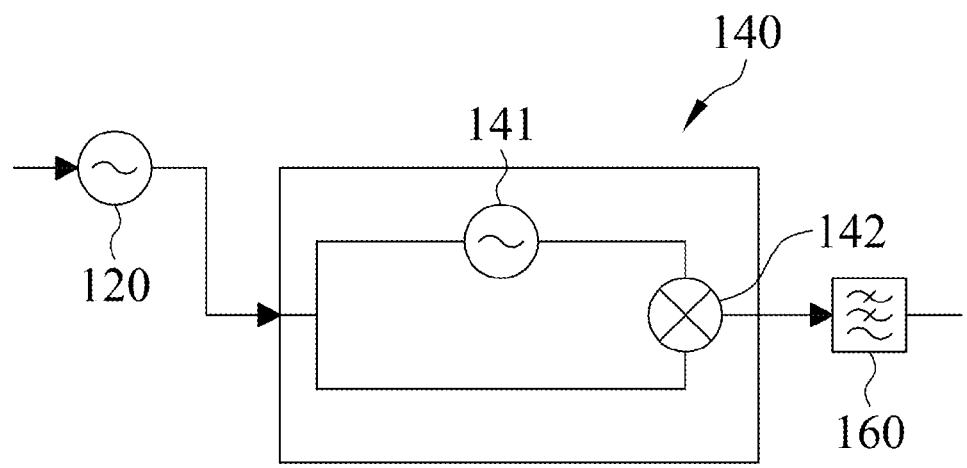
FIG. 2 is a circuit diagram of a frequency discriminator of the polar receiver using injection-locking technique with a preferred embodiment of the present invention.
Figure 3:
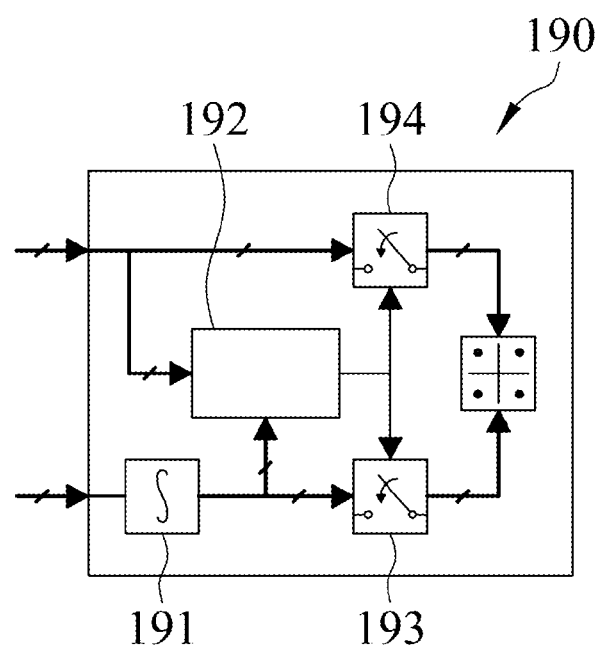
FIG. 3 is a circuit diagram of the digital signal processing unit of the polar receiver using injection-locking technique with a preferred embodiment of the present invention.
Figure 4B:
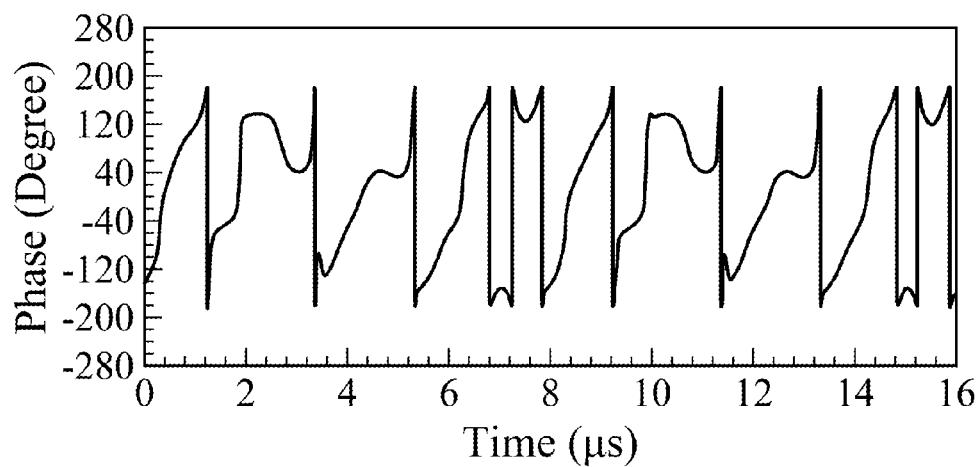
FIG. 4B is an oscillogram of a frequency-modulated signal of the polar receiver using injection-locking technique with a preferred embodiment of the present invention.

The frequency discriminator 140 receives the output signal of the first voltage-controlled oscillator 120 situated in the injection-locked state and outputs a frequency signal. With reference to FIG. 2, the frequency discriminator 140 includes a second voltage-controlled oscillator 141 and a second mixer 142 electrically connected with the second voltage-controlled oscillator 141, wherein the first voltage-controlled oscillator 120 is electrically connected with the second voltage-controlled oscillator 141 and the second mixer 142, and the third filter 160 is electrically connected with the second mixer 142. The frequency discriminator 140 demodulates the output signal to output the frequency signal, and the third filter 160 receives the frequency signal and outputs a frequency modulated signal $\Omega(t)$. In this embodiment, the third filter 160 is a low pass filter. The polar receiver using injection-locking technique 100 combines the injection-locking function of the first voltage-controlled oscillator 120, frequency demodulation of the frequency discriminator 140 and filtration function of the third filter 160 to effectively separate the frequency modulated component from the radio frequency signal $S_R(t)$, as indicated in FIG. 4B.

Figure 5:
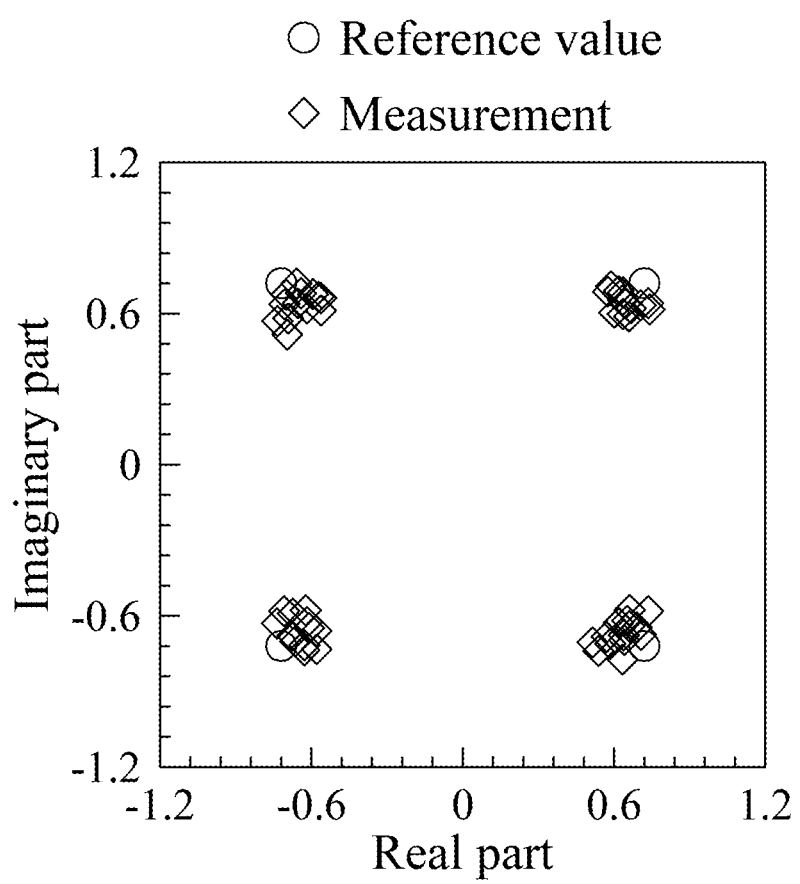
FIG. 5 is a constellation diagram of the polar receiver using injection-locking technique under QPSK demodulation with a preferred embodiment of the present invention.

When the envelope signal $X(t)$ and the frequency modulated signal $\Omega(t)$ are separated from the radio frequency signal $S_R(t)$, the first analog-digital converter 170 receives the envelope signal $X(t)$ and converts the envelope signal $X(t)$ into a first digital signal, and the second analog-digital converter 180 receives the frequency modulated signal $\Omega(t)$ and converts the frequency modulated signal $\Omega(t)$ into a second digital signal. The digital signal processing unit 190 receives the first digital signal and the second digital signal, and a demodulated output signal is obtainable by means of digital process of the first digital signal and the second digital signal. In this embodiment, the digital signal processing unit 190 comprises an integrator 191, a symbol synchronization circuit 192, a first sampler 193 and a second sampler 194, wherein the second analog-digital converter 180 is electrically connected with the integrator 191, the integrator 191 is electrically connected with the symbol synchronization circuit 192 and the first sampler 193, the first analog-digital converter 170 is electrically connected with the symbol synchronization circuit 192 and the second sampler 194, and the symbol synchronization circuit 192 is electrically connected with the first sampler 193 and the second sampler 194. The integrator 191 enables to convert the second digital signal into a phase-modulated signal. When a differential delay between the first digital signal and the phase-modulated signal is induced through preceding circuit processing, the symbol synchronization circuit 192 calibrates the path mismatch between the first digital signal and the phase-modulated signal and transmits sampling data to the first sampler 193 and the second sampler 194 to make each sampler capable of sampling the first digital signal and the phase modulated signal in a specific period of time to eliminate the time-order error of the signals so that a polar demodulation function can be achieved. FIG. 5 is a constellation diagram of the polar receiver using injection-locking technique under QPSK demodulation.

In this invention, the polar receiver using injection-locking technique 100 combines the injection-locking function of the first voltage-controlled oscillator 120, the first mixer 130 and the second filter 150 to separate the envelope component from the radio frequency signal. Besides, the polar receiver using injection-locking technique 100 further combines the injection-locking function of the first voltage-controlled oscillator 120, the frequency discriminator 140 and the third filter 160 to separate the frequency-modulated component from the radio frequency signal $S_R(t)$. The envelope component and the frequency-modulated component enable to be digitally processed by the digital signal processing unit 190 so as to accomplish radio frequency signal demodulation. Owing to simplicity, low cost and high energy efficiency of the present invention, the proposed polar receiver is applicable in the field of green radio.

While this invention has been particularly illustrated and described in detail with respect to the preferred embodiments thereof, it will be clearly understood by those skilled in the art that it is not limited to the specific features and describes, and various modifications and changes in form and details may be made without departing from the spirit and scope of this invention.

What is claimed is:

1. A polar receiver using injection-locking technique comprising:
   an antenna configured to receive a radio frequency signal;
   a first filter electrically connected with the antenna and configured to receive the radio frequency signal and output an initial signal;
   a first voltage-controlled oscillator electrically connected with the first filter and configured to receive the initial signal and output an output signal, and the output signal has an oscillation frequency;
   a first mixer electrically connected with the first filter and the first voltage-controlled oscillator, wherein the first mixer combines the initial signal and the output signal of the first voltage-controlled oscillator to form a mixed signal;
   a frequency discriminator electrically connected with the first voltage-controlled oscillator and configured to receive the output signal of the first voltage-controlled oscillator and output a frequency signal;
   a second filter electrically connected with the first mixer and configured to receive the mixed signal and output an envelope signal;
   a third filter electrically connected with the frequency discriminator and configured to receive the frequency signal and output a frequency modulated signal;
   a first analog-digital converter electrically connected with the second filter and configured to receive the envelope signal and output a first digital signal;
   a second analog-digital converter electrically connected with the third filter and configured to receive the frequency modulated signal and output a second digital signal; and
   a digital signal processing unit electrically connected with the first analog-digital converter and the second analog-digital converter, wherein the digital signal processing unit receives the first digital signal and the second digital signal, and a demodulated output signal is obtainable by means of digital process of the first digital signal and the second digital signal.

2. The polar receiver using injection-locking technique in accordance with claim 1, wherein the frequency discriminator includes a second voltage-controlled oscillator and a second mixer electrically connected with the second voltage-controlled oscillator, the first voltage-controlled oscillator is electrically connected with the second voltage-controlled oscillator and the second mixer, and the third filter is electrically connected with the second mixer.

3. The polar receiver using injection-locking technique in accordance with claim 1, wherein the digital signal processing unit comprises an integrator, a symbol synchronization circuit and a first sampler, the second analog-digital converter is electrically connected with the integrator, and the integrator is electrically connected with the symbol synchronization circuit and the first sampler.

4. The polar receiver using injection-locking technique in accordance with claim 3, wherein the digital signal processing unit further comprises a second sampler, the first analog-digital converter is electrically connected with the symbol synchronization circuit and the second sampler, and the symbol synchronization circuit is electrically connected with the first sampler and the second sampler.

5. The polar receiver using injection-locking technique in accordance with claim 1, wherein the first voltage-controlled oscillator has a signal-injection port, and the initial signal is injected into the signal-injection port of the first voltage-controlled oscillator.

6. The polar receiver using injection-locking technique in accordance with claim 1, wherein the first filter is a band pass filter.

7. The polar receiver using injection-locking technique in accordance with claim 1, wherein the second filter and the third filter are low pass filters.

* * * * *